United States Patent
You et al.

(10) Patent No.: US 9,287,010 B1
(45) Date of Patent: Mar. 15, 2016

(54) REPAIR SYSTEM FOR SEMICONDUCTOR APPARATUS AND REPAIR METHOD USING THE SAME

(71) Applicant: SK hynix Inc., Icheon-si Gyeonggi-do (KR)

(72) Inventors: Jung Taek You, Icheon-si (KR); Byung Kuk Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/607,699

(22) Filed: Jan. 28, 2015

(30) Foreign Application Priority Data

Nov. 6, 2014  (KR) ........................ 10-2014-0153732

(51) Int. Cl.
*G11C 16/06* (2006.01)
*G11C 29/00* (2006.01)
*G11C 29/04* (2006.01)
*G11C 17/16* (2006.01)

(52) U.S. Cl.
CPC ................ *G11C 29/78* (2013.01); *G11C 17/16* (2013.01); *G11C 29/04* (2013.01)

(58) Field of Classification Search
CPC .. G11C 29/44; G11C 29/4401; G11C 29/802; G11C 17/16; G11C 2029/1208; G11C 2029/4402
See application file for complete search history.

(56) References Cited

U.S. PATENT DOCUMENTS

| 5,644,541 | A | * | 7/1997 | Siu | G11C 29/80 365/189.07 |
|---|---|---|---|---|---|
| 5,917,764 | A | * | 6/1999 | Ohsawa | G11C 29/72 365/189.07 |
| 6,373,758 | B1 | * | 4/2002 | Hughes | G11C 29/72 365/200 |
| 7,053,470 | B1 | * | 5/2006 | Sellers | G11C 29/44 365/185.09 |
| 8,234,527 | B2 | * | 7/2012 | Mohr | G11C 17/18 365/201 |
| 2004/0136257 | A1 | * | 7/2004 | Nelson | G11C 29/4401 365/225.7 |
| 2010/0157703 | A1 | * | 6/2010 | Fischer | G11C 29/027 365/200 |
| 2013/0235644 | A1 | * | 9/2013 | Chung | G11C 17/16 365/103 |

FOREIGN PATENT DOCUMENTS

KR  1020140050975 A  4/2014

* cited by examiner

*Primary Examiner* — Tuan T Nguyen
(74) *Attorney, Agent, or Firm* — William Park & Associates Ltd.

(57) ABSTRACT

A repair system for a semiconductor apparatus includes a tester configured to generate memory repair data including a die identification information and repair addresses, and a command to perform a repair process; and a semiconductor apparatus including a plurality of dies configured to receive the memory repair data, wherein one of the dies corresponding to the die identification information performs a repair operation according to the repair addresses and the command.

20 Claims, 7 Drawing Sheets

REPAIR SYSTEM FOR SEMICONDUCTOR APPARATUS AND REPAIR METHOD USING THE SAME

CROSS-REFERENCES TO RELATED APPLICATION

The present application claims priority under 35 U.S.C. §119(a) to Korean application number 10-2014-0153732, filed on Nov. 6, 2014, in the Korean Intellectual Property Office, which is incorporated herein by reference in its entirety.

BACKGROUND

1. Technical Field

Various embodiments generally relate to a semiconductor apparatus, and more particularly, to a repair system for a semiconductor apparatus and a repair method using the same.

2. Related Art

A semiconductor device may detect a cell in which a fail has occurred (hereinafter, referred to as a "failed cell"), through a test.

In the operation of a semiconductor circuit, in the case where an address provided from an exterior is an address for accessing a failed cell, an access is made not to the failed cell but to a redundant memory cell (hereinafter, referred to as a "redundant cell") allocated to the failed cell, which may be referred to as a repair operation.

An address information for accessing a failed cell may be referred to as a failed address information.

The failed address information may be stored in a fuse set.

A circuit design for processing a fuse information, that is, a failed address information stored in a fuse set, to be used in a repair operation, and a time required to process the failed address information may serve as important factors that influence the operational performance of a semiconductor apparatus.

SUMMARY

In an embodiment, a repair system for a semiconductor apparatus may include a tester configured to generate memory repair data including a die identification information and repair addresses, and a command to perform a repair process. The repair system may also include a semiconductor apparatus including a plurality of dies configured to receive the memory repair data. One of the dies corresponding to the die identification information is configured to perform a repair operation according to the repair addresses and the command.

In an embodiment, a repair method for a semiconductor apparatus may include generating memory repair data configured by a plurality of data sets each including a die identification information, by a tester. The repair method may also include writing sequentially the plurality of data sets in a semiconductor apparatus by the tester. Further, the repair method may include performing by a plurality of dies of the semiconductor apparatus, fuse rupture according to the data sets corresponding to the plurality of dies among the plurality of data sets according to the die identification information.

In an embodiment, a repair system for a semiconductor apparatus may include a tester configured to generate memory repair data according to a repair algorithm and provide the memory repair data and commands and addresses through a command/address interface. The repair system may also include a semiconductor apparatus configured to perform a repair operation in response to receiving the memory repair data and the commands and the addresses.

DETAILED DESCRIPTION

Hereinafter, a repair system for a semiconductor apparatus and a repair method using the same will be described below with reference to the accompanying figures various embodiments. Various embodiments are directed to a repair system for a semiconductor apparatus, which may decrease a repair time, and a repair method using the same.

Figure 1:
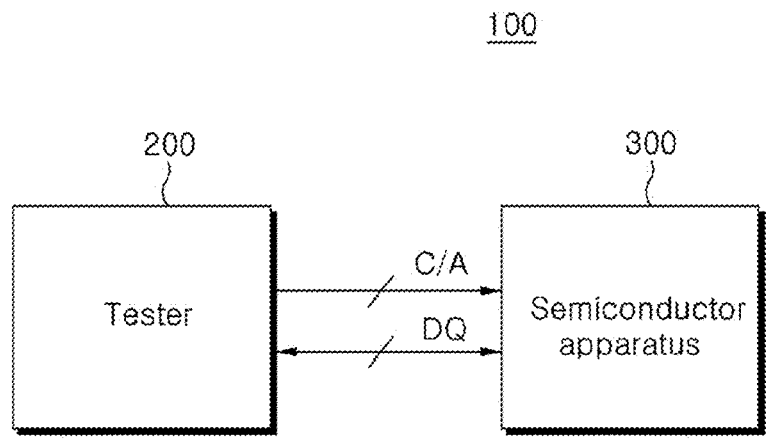
FIG. 1 is a block diagram illustrating a representation of an example of a repair system for a semiconductor apparatus in accordance with an embodiment.

Referring to FIG. 1, a repair system 100 for a semiconductor apparatus in accordance with an embodiment may include a tester 200 and a semiconductor apparatus 300.

The tester 200 may be configured to generate memory repair data (hereinafter MRD) according to a repair algorithm installed therein. The tester 200 may also provide the generated MRD and various commands/addresses for performing a repair process to the semiconductor apparatus 300. Further, the tester 200 may be configured to generate the MRD including die identification information and repair addresses, and a command for performing a repair process.

The tester 200 may transmit the MRD through a data input/output interface DQ to the semiconductor apparatus 300.

The tester 200 may transmit the commands/addresses through a command/address interface C/A to the semiconductor apparatus 300.

The semiconductor apparatus 300 may be configured to perform a repair operation in response to the MRD and the commands/addresses.

Figure 2:
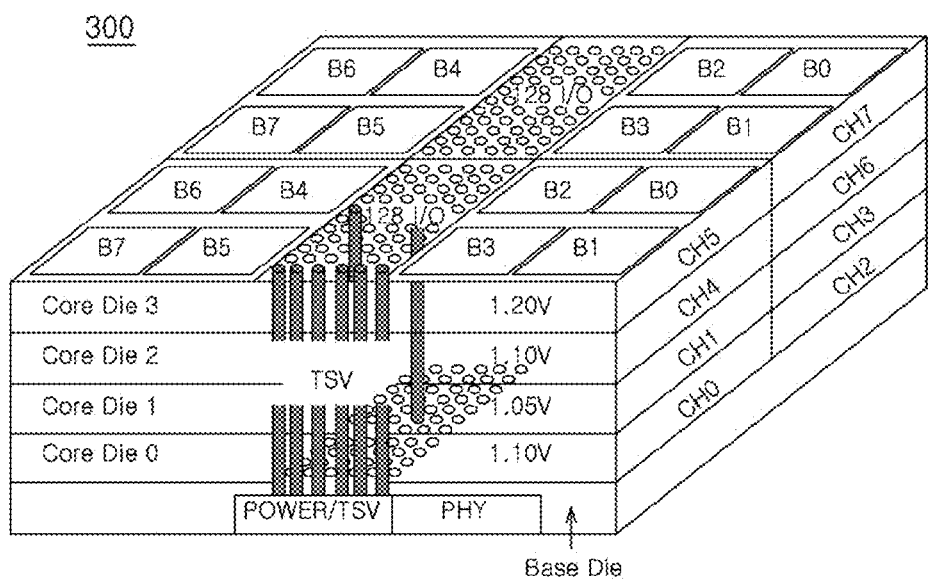
FIG. 2 is a perspective view illustrating a representation of an example of the semiconductor apparatus shown in FIG. 1.

Referring to FIG. 2, a plurality of dies may be stacked in the semiconductor apparatus 300 in accordance with an embodiment of the invention.

The plurality of dies may include a base die Base Die and core dies Core Die 0 to Core Die 3 configured to receive the MRD. A die among the plurality of dies corresponding to the die identification information is configured to perform a repair operation according to the repair addresses and the command.

The base die Base Die may include a PHY region and various logic circuits to perform an interfacing function between an exterior of the semiconductor apparatus 300, or the tester 200, and the core dies Core Die 0 to Core Die 3.

The core dies Core Die 0 to Core Die 3 may include memory regions and circuit configurations to process data.

Each of the core dies Core Die 0 to Core Die 3 may include pluralities of memory banks B0 to B7 and input/output logics 128 I/O.

The respective core dies Core Die 0 to Core Die 3 may be identified by channels, based on left and right memory banks B0 to B7 (identification is made by using the terms, left and right, for convenience in explanation). For example, the core die Core Die 0 may be identified by channels CH0 and CH2. In addition, the core die Core Die 3 may be identified by channels CH5 and CH7. FIG. 2 also illustrates channels CH1, CH3, CH4 and CH6.

The base die Base Die and the core dies Core Die 0 to Core Die 3 may be configured to share the MRD and the commands/addresses provided from the tester 200 through vias, for example, through-silicon vias (TSV). FIG. 2 also illustrates voltages 1.10V, 1.05V, 1.10V and 1.20V for Core Dies 0 to 3.

Figure 3:
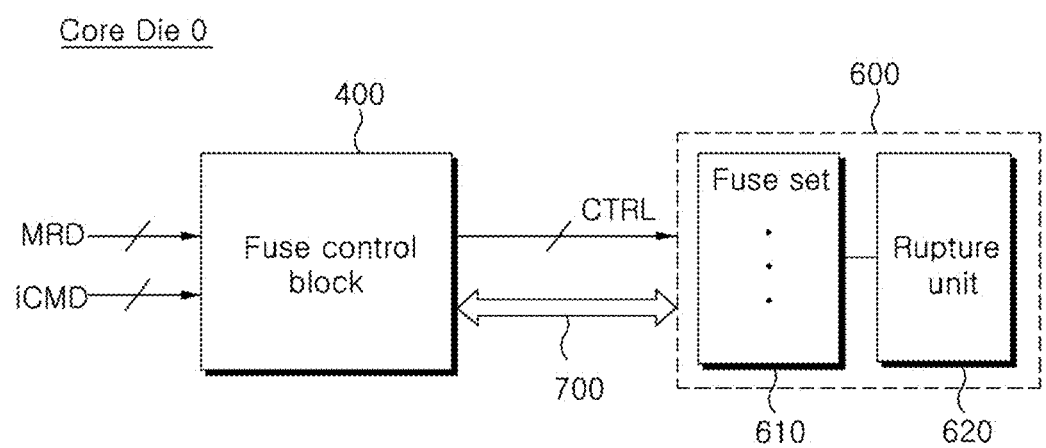
FIG. 3 is a block diagram illustrating a representation of an example of the internal configuration of the core die 0 of the semiconductor apparatus shown in FIG. 2.

Referring to FIG. 3, each of the core dies Core Die 0 to Core Die 3, may further include a fuse control block 400 and a fuse block 600.

The fuse control block 400 and the fuse block 600 may be electrically coupled through an input/output bus 700.

The fuse block 600 may be configured to rupture a fuse set designated by a control signal CTRL in conformity with a repair address.

The fuse block 600 may include a fuse set array 610 which includes a plurality of fuse sets and a rupture unit 620.

The fuse set array 610 includes the plurality of fuse sets. An array E-fuse set (ARE) may be used as a fuse set.

The fuse set array 610 may have a structure substantially similar to the layout structure of memory cells.

The rupture unit 620 may be configured to selectively rupture the fuses of the fuse set array 610 according to the control signal CTRL.

The MRD may include repair addresses and fuse position informations of the fuse set array 610 to write the repair addresses.

The fuse control block 400 may be configured to generate the control signal CTRL according to the MRD and an internal command iCMD.

The fuse control block 400 may generate the control signal CTRL which allows a corresponding fuse set to be selected and repaired according to the internal command iCMD and the fuse position information of the fuse set array 610 included in the MRD.

The fuse control block 400 may provide the repair addresses included in the MRD through the input/output bus 700 to the fuse block 600.

The internal command iCMD may be a command generated by decoding the commands/addresses provided from the tester 200 in the semiconductor apparatus 300.

A repair method of the repair system 100 for a semiconductor apparatus in accordance with an embodiment will be described below with reference to FIG. 4.

Figure 4:
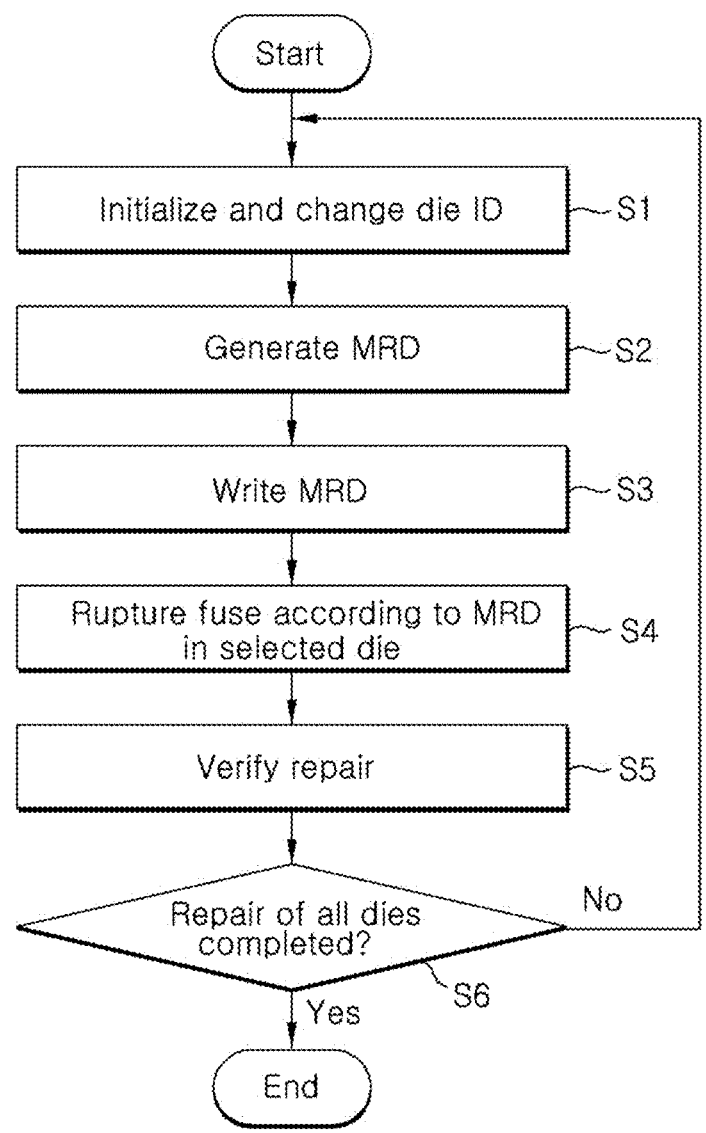
FIG. 4 is a representation of an example of a flow chart to assist in the explanation of a repair method of the repair system for a semiconductor apparatus in accordance with an embodiment.

Referring to FIG. 4, the tester 200 initializes and changes a die ID (S1).

The tester 200 initializes a previous die ID. The tester 200 also changes the die ID such that a die to be currently repaired may be selected among the core dies Core Die 0 to Core Die 3 shown in FIG. 2.

For example, when it is assumed that the core dies Core Die 0 to Core Die 3 are to be sequentially repaired according to that order, the die ID is changed to a value to select the core die Core Die 0.

The tester 200 generates the MRD according to the repair algorithm installed therein (S2).

The MRD may include a plurality of data sets, or one data set for one memory cell to be repaired.

Each data set may include a repair address and the fuse position information of the fuse set array 610 to write the repair address and the die identification information.

The tester 200 then writes the generated MRD in the semiconductor apparatus 300 (S3).

Fuse rupture is performed in a die selected according to the die ID, or the core die Core Die 0 according to the MRD (S4). The fuse rupture is performed according to the data sets corresponding to the plurality of dies mentioned above according to the die identification information. Moreover, the fuse rupture is performed when partial signal bits of a currently inputted data set among the plurality of data sets and a die ID stored in the plurality of respective dies have different values and correspond to each other.

By the fuse rupture, a repair operation for the core die Core Die 0, or an operation of storing repair addresses in the fuse block 600 of the core die Core Die 0 as fuse data may be performed.

The tester 200 performs repair verification to verify whether the repair operation has been normally performed (S5).

The step S5 may be implemented in such a manner that the tester 200 transmits a verification command to the semiconductor apparatus 300. Further, the semiconductor apparatus 300 performs self-verification by reading the fuse data of the fuse block 600 according to the verification command and transmits a verification result to the tester 200.

The step S5 may be implemented such that the semiconductor apparatus 300 transmits fuse data to the tester 200. In addition, the tester 200 performs an operation of verifying the transmitted fuse data.

The tester 200 determines whether repair of all dies is completed (S6).

If it is determined in the step S6 that repair of all dies is not completed, the process may return to the step S1. Accordingly, the steps S1 to S6 may be repeated.

Since the repair operation for the core die Core Die 0 is completed by the above description and repair operations for the remaining core dies Core Die 1 to Core Die 3 are not performed, the process returns to the step S1. In addition, the die ID is initialized and is changed to a value to select the core die Core Die 1.

By repeating such process, the repair operations for all core dies Core Die 0 to Core Die 3 may be performed.

If it is determined in the step S6 that repair of all core dies Core Die 0 to Core Die 3 is completed, the repair process is finished.

Figure 5:
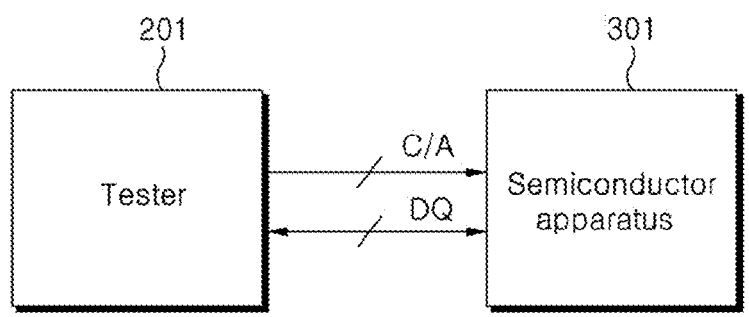
FIG. 5 is a block diagram illustrating a representation of an example of a repair system for a semiconductor apparatus in accordance with an embodiment.

Referring to FIG. 5, a repair system 101 for a semiconductor apparatus in accordance with an embodiment may include a tester 201 and a semiconductor apparatus 301.

The tester 201 may be configured to generate MRD including die identification informations, according to a repair algorithm installed therein. In addition, the tester 201 may provide the generated MRD and various commands/addresses to perform a repair process to the semiconductor apparatus 301.

The MRD may include the die identification informations, repair addresses and fuse position informations to write the repair addresses which will be described later in detail with reference to FIG. 7.

The tester 201 may transmit the MRD through a data input/output interface DQ to the semiconductor apparatus 301.

The tester 201 may transmit the commands/addresses through a command/address interface C/A to the semiconductor apparatus 301.

The semiconductor apparatus 301 may be configured such that a die defined in the MRD among a plurality of dies performs a repair operation in response to the repair addresses included in the MRD and the commands/addresses.

As described above in FIG. 2, in the semiconductor apparatus 301, a plurality of dies may be stacked although the plurality of dies may be different in terms of the internal configurations thereof from the plurality of dies shown in FIG. 2.

The plurality of dies may include a base die Base Die and core dies Core Die 0 to Core Die 3.

Figure 6:
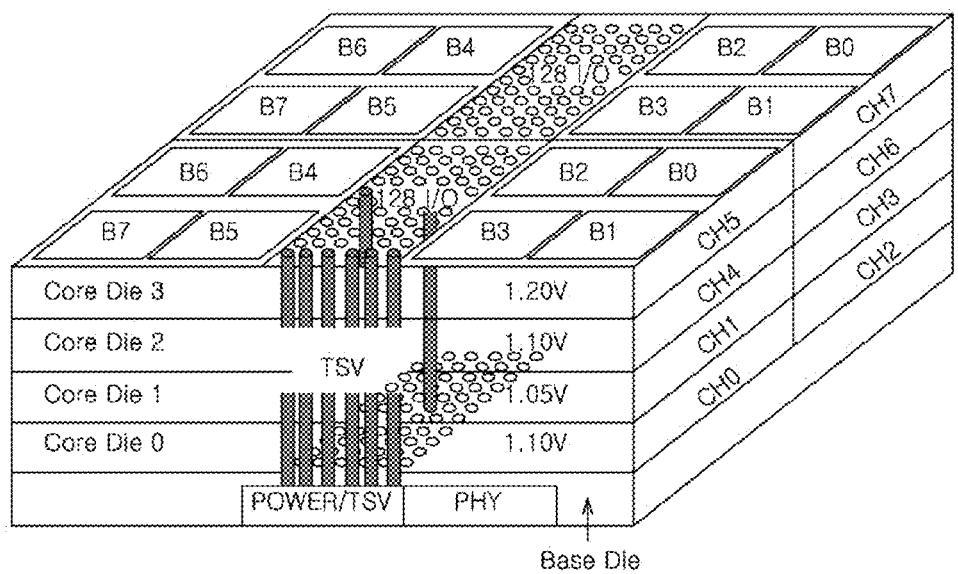
FIG. 6 is a perspective view illustrating a representation of an example of the semiconductor apparatus shown in FIG. 5.

Referring to FIG. 6, in the semiconductor apparatus 301 in accordance with an embodiment, a plurality of dies may be stacked.

The plurality of dies may include a base die Base Die and core dies Core Die 0 to Core Die 3.

The base die Base Die may include a PHY region and various logic circuits to perform an interfacing function between an exterior of the semiconductor apparatus 301 or the tester 201, and the core dies Core Die 0 to Core Die 3.

The core dies Core Die 0 to Core Die 3 may include memory regions and circuit configurations to process data.

Each of the core dies Core Die 0 to Core Die 3 may include pluralities of memory banks B0 to B7 and input/output logics 128 I/O.

The respective core dies Core Die 0 to Core Die 3 may be identified by channels based on left and right memory banks B0 to B7 (identification is made by using the terms, left and right, for convenience in explanation). For example, the core die Core Die 0 may be identified by channels CH0 and CH2. In addition, the core die Core Die 3 may be identified by channels CH5 and CH7.

The base die Base Die and the core dies Core Die 0 to Core Die 3 may be configured to share the MRD and the commands/addresses provided from the tester 201 through vias, for example, through-silicon vias (TSV).

Figure 7:
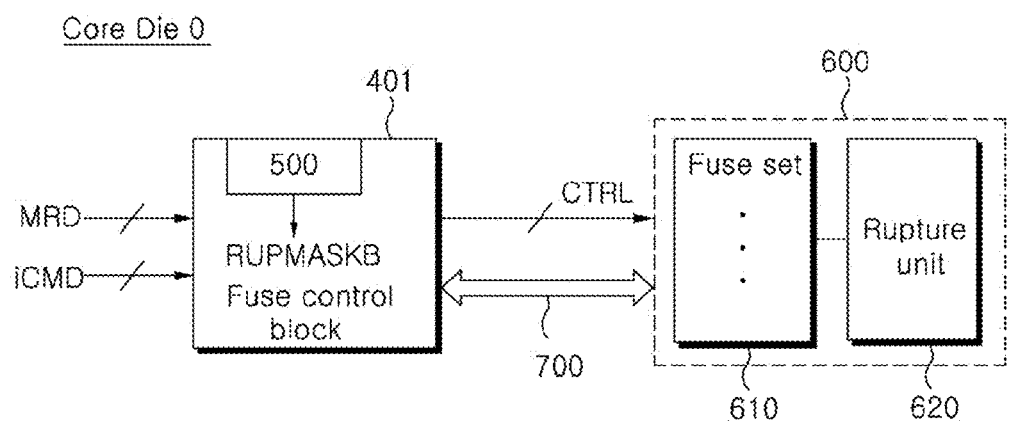
FIG. 7 is a block diagram illustrating a representation of an example of the internal configuration of the core die 0 of the semiconductor apparatus shown in FIG. 6.

Referring to FIG. 7, each of the core dies Core Die 0 to Core Die 3, may further include a fuse control block 401 and a fuse block 600.

The fuse control block 401 and the fuse block 600 may be electrically coupled through an input/output bus 700.

The fuse block 600 may be configured to rupture a fuse set designated by a control signal CTRL in conformity with a repair address.

The fuse block 600 may include a fuse set array 610 which includes a plurality of fuse sets and a rupture unit 620.

The fuse set array 610 includes the plurality of fuse sets. An array E-fuse set (ARE) may be used as a fuse set.

The fuse set array 610 may have a structure substantially similar to the layout structure of memory cells.

The rupture unit 620 may be configured to selectively rupture the fuses of the fuse set array 610 according to the control signal CTRL.

The MRD may include the die identification informations, the repair addresses and the fuse position informations of the fuse set array 610 to write the repair addresses.

The fuse control block 401 may be configured to determine whether the repair addresses included in the MRD correspond to it according to the die identification information included in the MRD. The fuse control block 401 may also generate the control signal CTRL for the repair operation of the fuse block 600 in response to an internal command iCMD and the MRD when it is determined that the repair addresses included in the MRD correspond to it.

The fuse control block 401 may generate the control signal CTRL which allows a corresponding fuse set to be selected and repaired according to the internal command iCMD and the fuse position information of the fuse set array 610 included in the MRD. Further, the fuse control block may be configured to generate the control signal by determining whether the repair address corresponds to a die according to the die identification information.

The fuse control block 401 may provide the repair addresses included in the MRD through the input/output bus 700 to the fuse block 600.

The internal command iCMD may be a command generated by decoding the commands/addresses provided from the tester 201 in the semiconductor apparatus 301.

The fuse control block 401 may include a repair determination unit 500 configured to generate a rupture mask signal RUPMASKB to mask the repair operation according to the die identification information included in the MRD.

Figure 8:
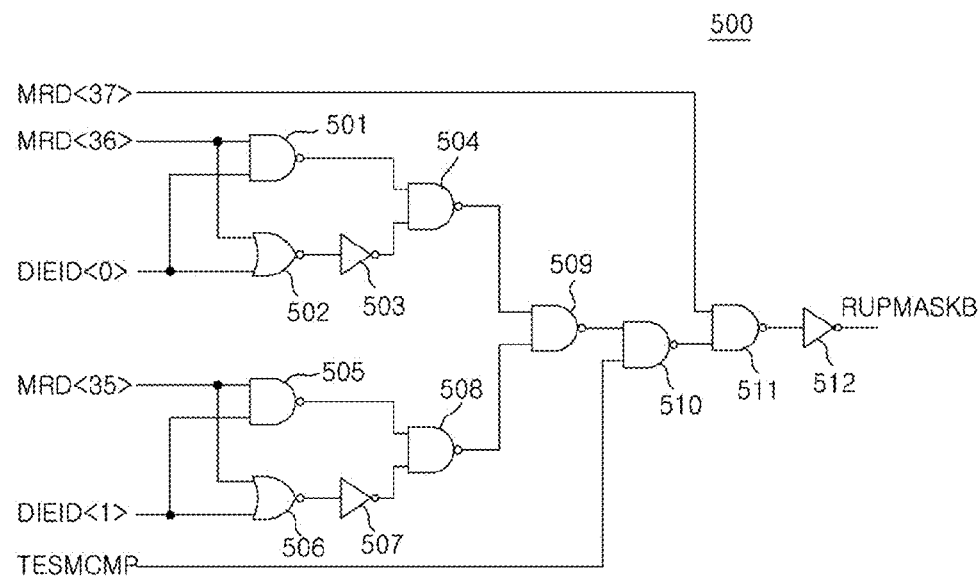
FIG. 8 is a circuit diagram illustrating a representation of an example of the repair determination unit shown in FIG. 7.

Referring to FIG. 8, the repair determination unit 500 may be configured to generate the rupture mask signal RUPMASKB in response to partial signal bits MRD<35:37> of the MRD and an die ID DIEID<0:1>.

The die ID DIEID<0:1> is stored as different values in the respective core dies Core Die 0 to Core Die 3.

The die ID DIEID<0:1> may be stored as, for example, '00,' '01', '10' and '11' for the respective core dies Core Die 0 to Core Die 3.

The MRD may be configured by a plurality of signal bits. Further, there are extra signal bits by excluding the signal bits allocated to the repair addresses and the fuse position informations of the fuse set array 610 to write the repair addresses among the plurality of signal bits.

As parts among the extra signal bits of the MRD, the signal bits MRD<35:36> may be used as the die identification informations to select the core dies Core Die 0 to Core Die 3. In addition, the signal bit MRD<37> may be used as an information to define whether to perform the repair operation.

The repair determination unit 500 may enable the rupture mask signal RUPMASKB to a logic low according to the signal bit MRD<37>. Further, the repair determination unit 500 may thereby mask the repair operation when the signal bits MRD<35:36> correspond to the die ID DIEID<0:1>.

The repair determination unit 500 may enable the rupture mask signal RUPMASKB to the logic low and thereby mask the repair operation when the signal bits MRD<35:36> correspond to the die ID DIEID<0:1> and the signal bit MRD<37> is a logic low.

The fuse control block 401 does not generate the control signal CTRL regardless of the internal command iCMD when the rupture mask signal RUPMASKB is enabled to the logic low.

The repair determination unit 500 may disable the rupture mask signal RUPMASKB to a logic high and thereby allow the repair operation to be performed when the signal bits MRD<35:36> correspond to the die ID DIEID<0:1> and the signal bit MRD<37> is a logic high value.

The repair determination unit 500 may be configured to enable or disable the rupture mask signal RUPMASKB according to the signal bit MRD<37> regardless of the signal bits MRD<35:36> by using a test signal TESMCMP.

The repair determination unit 500 may generate the rupture mask signal RUPMASKB to the logic low or the logic high according to the signal bit MRD<37> regardless of the signal bits MRD<35:36> when the test signal TESMCMP is a logic low.

The repair determination unit 500 may include first to twelfth logic gates 501 to 512.

The first logic gate 501 NANDs or performs a NAND logic function on the signal bit MRD<36> and the die ID DIEID<0>. In addition, the first logic gate 501 outputs an output.

The second logic gate 502 NORs or performs a NOR logic function on the signal bit MRD<36> and the die ID DIEID<0>. Further, the second logic gate 502 outputs an output.

The third logic gate 503 inverts the output of the second logic gate 502 and outputs an output.

The fourth logic gate 504 NANDs or performs a NAND logic function on the output of the first logic gate 501 and the output of the third logic gate 503. Further, the fourth logic gate 504 outputs an output.

The fifth logic gate 505 NANDs or performs a NAND logic function on the signal bit MRD<35> and the die ID DIEID<1>. In addition, the fifth logic gate 505 outputs an output.

The sixth logic gate 506 NORs or performs a NOR logic function on the signal bit MRD<35> and the die ID DIEID<1>. Moreover, the sixth logic gate 506 outputs an output.

The seventh logic gate 507 inverts the output of the sixth logic gate 506. In addition, the seventh logic gate 507 outputs an output.

The eighth logic gate 508 NANDs or performs a NAND logic function on the output of the fifth logic gate 505 and the output of the seventh logic gate 507. Further, the eighth logic gate 508 outputs an output.

The ninth logic gate 509 NANDs or performs a NAND logic function on the output of the fourth logic gate 504 and the output of the eighth logic gate 508. Moreover, the ninth logic gate 509 outputs an output.

The tenth logic gate 510 NANDs or performs a NAND logic function on the output of the ninth logic gate 509 and the test signal TESMCMP. The tenth logic gate 510 also outputs an output.

The eleventh logic gate 511 NANDs or performs a NAND logic function on the output of the tenth logic gate 510 and the signal bit MRD<37>. The eleventh logic gate 511 also outputs an output.

The twelfth logic gate 512 inverts the output of the eleventh logic gate 511 and also outputs the rupture mask signal RUPMASKB.

A repair method of the repair system 101 for a semiconductor apparatus in accordance with an embodiment will be described below with reference to FIG. 9.

Figure 9:
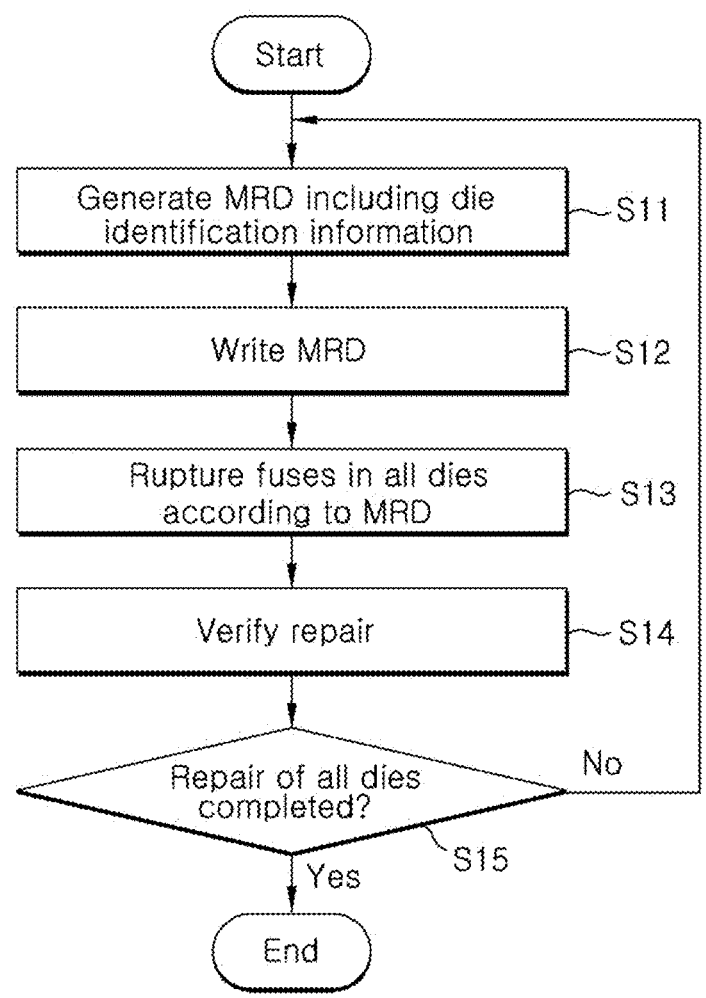
FIG. 9 is a representation of an example of a flow chart to assist in the explanation of a repair method of the repair system for a semiconductor apparatus in accordance with an embodiment.

Referring to FIG. 9, the tester 201 generates the MRD including the die identification informations according to the repair algorithm installed therein (S11).

The MRD may include a plurality of data sets, or one data set for one memory cell to be repaired.

Each data set may include a repair address, the fuse position information of the fuse set array 610 to write the repair address, and the die identification information.

The tester 201 writes the generated MRD in the semiconductor apparatus 301 (S12).

The step S12 may be implemented as the tester 201 sequentially writes the data sets of the MRD in the semiconductor apparatus 301.

The core dies Core Die 0 to Core Die 3 perform fuse rupture according to the MRD (S13).

The step S13 may be sequentially or randomly implemented for the core dies Core Die 0 to Core Die 3 according to which die identification information the data set of the MRD to be written in the semiconductor apparatus 301 has.

More specifically, if 4 memory cells to be repaired exist in each of the core dies Core Die 0 to Core Die 3, the MRD may include first to sixteenth data sets as a result.

The first to sixteenth data sets may include the die identification informations which define the respective core dies Core Die 0 to Core Die 3.

For example, the first to fourth data sets may include the die identification information which defines the core die Core Die 0.

As described above in FIG. 8, the signal bits MRD<35:36> may be used as the die identification informations.

The fifth to eighth data sets may include the die identification information which defines the core die Core Die 1.

The ninth to twelfth data sets may include the die identification information which defines the core die Core Die 2.

The thirteenth to sixteenth data sets may include the die identification information which defines the core die Core Die 3.

When assuming that the first to sixteenth data sets are sequentially written in the semiconductor apparatus 301, the core die Core Die 0 may perform fuse rupture according to the first to fourth data sets.

The first to fourth data sets include the die identification information which defines the core die Core Die 0.

Therefore, where the first to fourth data sets are written in the semiconductor apparatus 301, in the remaining core dies Core Die 1 to Core Die 3, the rupture mask signal RUPMASKB described above with reference to FIG. 8 is enabled to the logic low and repair operations are masked.

The tester 201 performs repair verification to verify whether the repair operation of the core die Core Die 0 has been normally performed, or an operation to determine whether the fuse rupture operation has been precisely performed (S14).

The step S14 may be implemented such that the tester 201 transmits a verification command to the semiconductor apparatus 301. Further, the semiconductor apparatus 301 performs self-verification by reading the fuse data of the fuse block 600 according to the verification command and transmits a verification result to the tester 201.

The step S14 may be implemented such that the tester 201 transmits a verification command to the semiconductor apparatus 301. In addition, the semiconductor apparatus 301 transmits fuse data to the tester 201 according to the verification command and the tester 201 performs an operation of verifying the transmitted fuse data.

The tester 201 determines whether repair of all dies is completed (S15).

If it is determined in the step S15 that repair of all dies is not completed, the process may return to the step S11. In addition, the steps S11 to S15 may be repeated.

Since the repair operation for the core die Core Die 0 is completed by the above description and repair operations for the remaining core dies Core Die 1 to Core Die 3 are not performed, the core dies Core Die 1 to Core Die 3 may perform fuse rupture according to the fifth to sixteenth data sets of the MRD.

Where the fifth to eighth data sets are written in the semiconductor apparatus 301, the repair operation is performed for the core die Core Die 1. In addition, the repair operations of the remaining core dies Core Die 0, Core Die 2 and Core Die 3 are masked by the rupture mask signal RUPMASKB.

When the ninth to twelfth data sets are written in the semiconductor apparatus 301, the repair operation is performed for the core die Core Die 2. Further, the repair operations of the remaining core dies Core Die 0, Core Die 1 and Core Die 3 are masked by the rupture mask signal RUPMASKB.

Where the thirteenth to sixteenth data sets are written in the semiconductor apparatus 301, the repair operation is performed for the core die Core Die 3. In addition, the repair operations of the remaining core dies Core Die 0, Core Die 1 and Core Die 2 are masked by the rupture mask signal RUPMASKB.

By repeating such process, the repair operations for all core dies Core Die 0 to Core Die 3 may be performed.

If it is determined in the step S15 that repair of all core dies Core Die 0 to Core Die 3 is completed, the repair process is ended.

Figure 10:
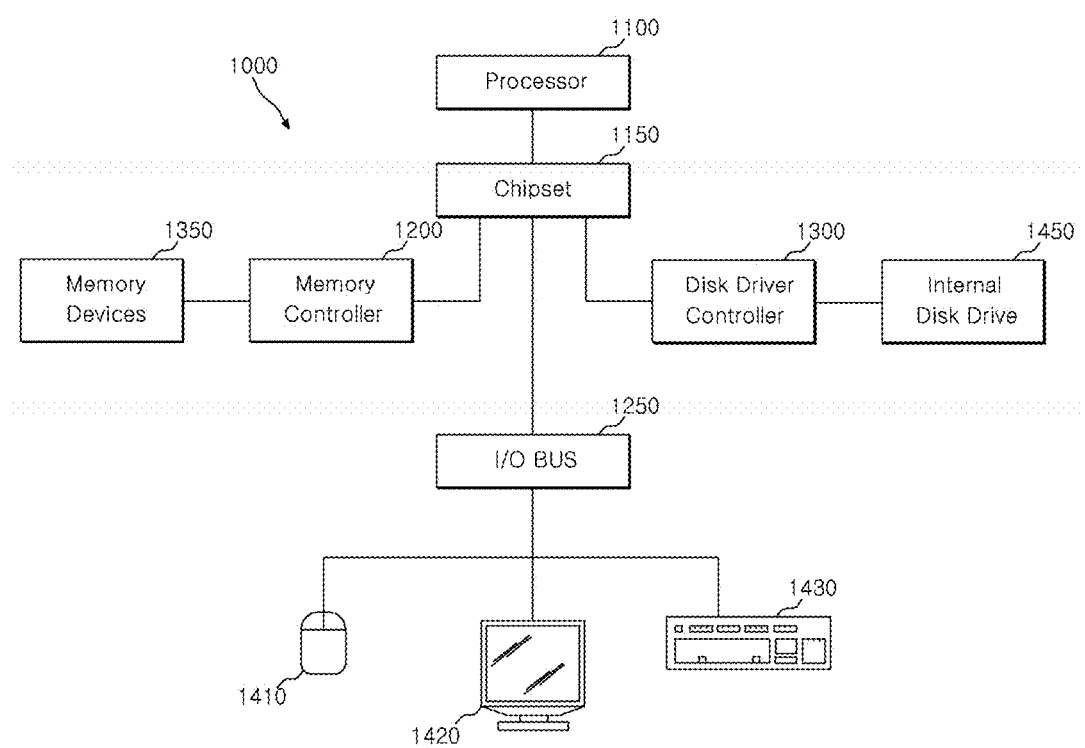
FIG. 10 illustrates a block diagram of a system employing a memory controller circuit in accordance with an embodiment of the invention.

Referring to FIG. 10, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of examples only. Accordingly, the repair system for a semiconductor apparatus and the repair method using the same described should not be limited based on the described embodiments.

What is claimed is:

1. A repair system for a semiconductor apparatus, comprising:
   a tester configured to generate memory repair data including a die identification information and repair addresses, and a command to perform a repair process; and
   a semiconductor apparatus including a plurality of dies configured to receive the memory repair data, wherein one of the plurality of dies corresponding to the die identification information is configured to perform a repair operation according to the repair addresses and the command.

2. The repair system according to claim 1, wherein the tester is configured to provide the memory repair data through a data input/output interface to the semiconductor apparatus.

3. The repair system according to claim 1, wherein the memory repair data include a plurality of data sets.

4. The repair system according to claim 3, wherein, when generating the memory repair data, the tester is configured to generate the memory repair data by including the die identification information to define any of the dies among the plurality of dies in each of the plurality of data sets.

5. The repair system according to claim 1, wherein the plurality of dies are configured to share the memory repair data through one or more through-silicon vias.

6. The repair system according to claim 1, wherein each of the plurality of dies is configured to generate a mask signal to mask its repair operation when the die identification information does not define it.

7. The repair system according to claim 1, wherein each of the plurality of dies comprises:
   a fuse block configured to rupture a fuse set designated by a control signal in conformity with a repair address; and
   a fuse control block configured to generate the control signal by determining whether the repair address corresponds to the die according to the die identification information.

8. The repair system according to claim 7, wherein the fuse block comprises:
   a fuse set array including a plurality of fuse sets; and
   a rupture unit configured to selectively rupture fuses of the fuse set array according to the control signal.

9. The repair system according to claim 7, wherein the fuse control block comprises:
   a repair determination unit configured to generate a rupture mask signal to mask the repair operation according to the die identification information.

10. The repair system according to claim 9, wherein the repair determination unit is configured to generate the rupture mask signal by determining whether partial signal bits of the memory repair data and a die ID stored in the plurality of respective dies to have different values correspond or not.

11. A repair method for a semiconductor apparatus, comprising:
    generating memory repair data configured by a plurality of data sets each including a die identification information by a tester;
    writing sequentially the plurality of data sets in a semiconductor apparatus by the tester; and
    performing by a plurality of dies of the semiconductor apparatus, fuse rupture according to the data sets corresponding to the plurality of dies among the plurality of data sets according to the die identification information.

12. The repair method according to claim 11, wherein the plurality of dies are configured to share the memory repair data through one or more through-silicon vias.

13. The repair method according to claim 11,
    wherein the semiconductor apparatus comprises a plurality of fuse sets, and
    wherein each of the plurality of data sets includes a repair address, a position information of any fuse set among the plurality of fuse sets, and the die identification information.

14. The repair method according to claim 11, wherein the performing of the fuse rupture comprises:

performing, by the plurality of dies, the fuse rupture when partial signal bits of a currently inputted data set among the plurality of data sets and a die ID stored in the plurality of respective dies to have different values correspond to each other.

15. The repair method according to claim 11, wherein the performing of the fuse rupture further comprises:
   masking fuse rupture operations of remaining dies excluding any of the plurality of dies according to the die identification information.

16. The repair method according to claim 11, further comprising:
   performing repair verification for the plurality of respective dies by the tester.

17. The repair method according to claim 16, wherein the performing of the repair verification comprising:
   transmitting a verification command to the semiconductor apparatus by the tester; and
   performing self-verification according to the verification command and transmitting a verification result to the tester by the semiconductor apparatus.

18. The repair method according to claim 16, wherein the performing of the repair verification comprising:
   transmitting a verification command to the semiconductor apparatus by the tester;
   transmitting fuse data generated due to the performing of the fuse rupture, to the tester according to the verification command by the semiconductor apparatus; and
   performing an operation of verifying the fuse data by the tester.

19. A repair system for a semiconductor apparatus, comprising:
   a tester configured to generate memory repair data according to a repair algorithm and provide the memory repair data and commands and addresses through a command/address interface; and
   a semiconductor apparatus configured to perform a repair operation in response to receiving the memory repair data and the commands and the addresses.

20. The repair system according to claim 19, wherein the tester is configured to perform a repair verification to verify whether the repair operation was performed.

\* \* \* \* \*